US006890635B2

(12) United States Patent
Lin et al.

(10) Patent No.: US 6,890,635 B2
(45) Date of Patent: May 10, 2005

(54) LOW LOSS DIELECTRIC MATERIAL FOR PRINTED CIRCUIT BOARDS AND INTEGRATED CIRCUIT CHIP PACKAGING

(75) Inventors: Pui-Yan Lin, Hockessin, DE (US); Govindasamy Paramasivan Rajendran, Boothwyn, PA (US); George Elias Zahr, Glen Mills, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 212 days.

(21) Appl. No.: 10/423,402

(22) Filed: Apr. 25, 2003

(65) Prior Publication Data

US 2004/0009727 A1 Jan. 15, 2004

Related U.S. Application Data

(60) Provisional application No. 60/376,164, filed on Apr. 26, 2002.

(51) Int. Cl.[7] .............................. D04H 1/04; H05K 1/00
(52) U.S. Cl. ............................... 428/295.1; 428/297.4; 428/901; 442/169; 442/180; 174/258
(58) Field of Search .................................. 428/392, 209, 428/295.1, 297.4, 901; 174/258; 442/236, 277, 169, 180

(56) References Cited

U.S. PATENT DOCUMENTS 3,094,511 A   6/1963   Hill et al.
3,149,182 A   9/1964   Porter et al.
3,265,765 A   8/1966   Holden et al.
3,354,127 A   11/1967  Hill et al.
3,673,143 A   6/1972   Bair et al.
3,819,587 A   6/1974   Kwoleck
3,869,429 A   3/1975   Blades
4,172,938 A   10/1979  Mera et al.
4,242,132 A   12/1980  Shapiro et al.
4,431,777 A   2/1984   Tung et al.
4,678,821 A * 7/1987   Logullo et al. ............. 523/205
5,223,568 A   6/1993   Landi et al.
5,314,742 A   5/1994   Kirayoglu et al.
5,910,231 A   6/1999   Kirayoglu et al.
6,048,807 A   4/2000   Landi
6,071,836 A   6/2000   St. Lawrence et al.
6,119,575 A   9/2000   Dragone et al.

FOREIGN PATENT DOCUMENTS

FR   1358492   4/1964
GB   1109616   4/1968

OTHER PUBLICATIONS

PCT/US03/12851, International Search Report dated Sep. 11, 2003.

* cited by examiner

*Primary Examiner*—Cathy Lam

(57) ABSTRACT

Disclosed are fiber reinforced composite substrates comprising a polymeric matrix and one or more woven or nonwoven para-aramid or fiberglass fabrics, sheets, or papers, said polymeric matrix consisting essentially of one or more cross-linked copolymers of monovinyl aromatic hydrocarbons and conjugated dienes useful for printed circuit boards and cards suitable for use in high frequency circuits.

28 Claims, No Drawings

LOW LOSS DIELECTRIC MATERIAL FOR PRINTED CIRCUIT BOARDS AND INTEGRATED CIRCUIT CHIP PACKAGING

FIELD OF THE INVENTION

The present invention is directed to composite sheets useful as a dielectric layer for printed circuit boards and cards particularly well-suited for use in circuits operated at gigahertz frequencies.

BACKGROUND OF THE INVENTION

Printed circuit boards and cards, also known as printed wiring boards, are ubiquitous in the $21^{st}$ century. There are many designs of printed circuit boards, such as those described in M. W. Jawitz "Printed Circuit Board Materials Handbook", McGraw-Hill (1997), Clyde Coombs, Jr., "Printed Circuits Handbook", McGraw-Hill (1996), and IPC/JPCA-2315 Standard "Design Guide for High Density Interconnects and Microvias", and many fabrication procedures. In general, they comprise an electrically insulating dielectric layer upon which is disposed a layer of a metal. The metal can be laminated, glued, sputtered, or plated on to the printed circuit boards substrate. In-typical commercial practice, the dielectric layer is made up of a fiber-reinforced composite sheet whereof the matrix resin is a cross-linked organic polymer such as epoxy. The metal-coated dielectric layer thus prepared is then subjected to a series of steps, all well-known in the art, to leave a circuit pattern upon the electrically insulating dielectric layer forming a so-called "circuitized layer". The circuit pattern serves to connect the various electronic components which will then be added to make up the desired electronic device. Such a circuitized layer can be used alone or in a multilayer stack as described in IPC/JPCA-2315 with vias and interlayer connections. Other layers in such multilayer stacks may optionally use other dielectric materials. It is known in the art to employ an uncured (i.e., uncrosslinked) dielectric "prepreg" as an interlayer adhesive.

The art further teaches the use of dielectric layers employed to form an integrated package with an integrated circuit chip (IC). For IC's with high input/ouput counts, these IC packages may consist of one or more bare IC chips attached to a circuitized substrate structure similar in construction to printed circuit boards but smaller in size. These circuitized substrate structures so employed are typically called IC chip substrates, chip carriers, or chip package interposers.

The requirements on the dielectric materials employed in printed circuit boards are stringent, involving both electrical and thermo-mechanical requirements. For this reason dielectric layers employed in the art are nearly always composite sheets made up of a reinforcing fabric impregnated with an organic polymer resin Generally the resin so-employed is cross-linked.

Suitable materials must be strong, easy to handle, and have a minimum of defects on the scale of several microns or less. The distribution of matrix resin or polymer and reinforcing fiber (in the form of a woven or non-woven fabric, sheet or paper) must be sufficiently uniform to afford minimum distortion and very high dimensional stability through a series of manufacturing steps which include solder bath temperatures typically in the range of 200° C.–300° C. They must offer excellent adhesion to metal. They must be chemically inert to the many solvents to which they will be exposed during the manufacturing operation.

Furthermore, when an electronic signal propagates through a conductor, an electromagnetic field permeates into the dielectric material adjacent to the conductor. The interaction between the dielectric material and this electromagnetic field affects the propagation properties of the signal. These interactions are especially important for high frequency applications. For these reasons, the dielectric properties of the composite sheet are important. In particular the dielectric constant determines the speed of signal propagation through the circuit and affects signal cross-talk between circuits, and the dissipation factor determines signal loss.

Current commercial printed circuit boards composite sheets include fiberglass or para-aramid fiber reinforcements. Non-woven para-aramid fabric such as Thermount® laminates available from DuPont, are typically embedded in a matrix of an epoxy resin. However, it is found that the epoxy composites do not exhibit desirable dielectric constants and dissipation factors for use at frequencies of ca. 1 GHz and higher. There is considerable incentive in the art to provide printed circuit boards which retain the desirable properties of the epoxy composites such as dimensional stability and good adhesion to metal while providing a decrease in dielectric constant and dissipation factor.

Dragone et al, U.S. Pat. No. 6,119,575, discloses a composite of para-aramid fibers in various configurations in a matrix of styrene butadiene styrene block copolymers said composite being employed as a component in body armor. No cross-linking is provided for in Dragone.

Landi et al, U.S. Pat. No. 5,223,568, discloses a process for producing a hard shaped molded article made by combining polybutadiene or polyisoprene with a solid butadiene or isoprene polymer, followed by shaping and heat curing. Para-aramid fibers are employed only as a minor, filler component.

Landi, U.S. Pat. No. 6,048,807, and St. Lawrence et al, U.S. Pat. No. 6,071,836, disclose polybutadiene and polyisoprene thermosetting compositions for use as an electrical substrate material. Disclosed are compositions comprising polybutadiene or polyisoprene, para-aramid fabric reinforcement, and an unsaturated block copolymer having blocks of polybutadiene and blocks of polystryene. In one embodiment which does not include an para-aramid reinforcement, the concentration of the block copolymer exceeds that of the homopolymer ingredient. It is clear in Landi and in St. Lawrence that the block copolymer is a non-essential additive since preferred embodiments are described which omit the block copolymer. Furthermore the inclusion of high levels of particulate fillers is stated to be essential.

Porter, U.S. Pat. No. 3,149,182, discloses a process for forming block copolymers using organolithium initiators.

Holden et al, U.S. Pat. No. 3,265,765 discloses block copolymers of monovinyl aromatic hydrocarbons and conjugated dienes.

Tung et al, U.S. Pat. No. 4,431,777, discloses block copolymers of diene having terminal end blocks of a random copoymer of styrene or alkylstyrene and an alphamethylstyrene.

Para-aramid fibers are disclosed in U.S. Pat. Nos. 4,172,938; 3,869,429; 3,819,587; 3,673,143; 3,354,127; and 3,094,511. WO 99/05360 discloses para-aramid papers formed from a mixture of para-aramid short fibers also known as floc, and fibrids. WO 94/23553 discloses a non-woven para-aramid sheet useful as reinforcement in printed circuit board laminates.

SUMMARY OF THE INVENTION

The present invention provides a composite sheet comprising a polymeric matrix and one or more woven or non-woven para-aramid or fiberglass fabrics or papers, said polymeric matrix consisting essentially of one or more copolymers of monovinyl aromatic hydrocarbons and conjugated dienes; said one or more copolymers being either cross-linked or not cross-linked, and wherein the para-aramid or fiberglass fibers in said woven or non-woven fabrics or papers occupy 20 to 60 volume-% of said composite sheet.

The present invention further provides a printed circuit board comprising one or more layers of circuitry whereof at least one said layer comprises a composite sheet having disposed upon the surface thereof a metallic layer, and a plurality of electronic circuit elements, said electronic circuit elements being disposed upon said composite sheet and said metallic layer being patterned to provide electronically conductive pathways to interconnect the electronic circuit elements; said composite sheet comprising a polymeric matrix and one or more woven or non-woven para-aramid or fiberglass fabric or paper, said polymeric matrix consisting essentially of one or more cross-linked copolymers of monovinyl aromatic hydrocarbons and conjugated dienes.

Further provided in the present invention is a process for fabricating a composite sheet the process comprising infusing into a woven or non-woven para-aramid or fiberglass fabric or paper a solution or dispersion comprising a polymeric matrix consisting essentially of at least one block copolymer comprising blocks formed from monovinyl aromatic hydrocarbon monomer units and blocks formed from conjugated diene monomer units; contacting said copolymer with a free radical initiator and a coagent, and heating the thus formed combination to a temperature at which the free radical initiator is activated in order to effect cross-linking.

DETAILED DESCRIPTION

In order to provide practical utility at signal transmission frequencies in the gigahertz range, a suitable dielectric layer must exhibit a dielectric constant <4, preferably <3.6, at 1 GHz and a dissipation factor <0.02, preferably <0.01 at 1 GHz, under dry conditions are required. In order to provide sufficient survivability in the fabrication process and improved life cycle reliability, the dielectric layer must exhibit an in-plane coefficient of thermal expansion (CTE) of <16 ppm/° C., preferably <13 ppm/° C., in the temperature range of 50–150° C., and a coefficient of thermal expansion normal to the plane of <400 ppm/° C., preferably <200 ppm/° C.

In the present invention, a widely available, inexpensive polymeric material characterized by a low dielectric constant and a low dissipation factor but a high CTE is combined with a reinforcing fabric of para-aramid or glass fiber which exhibits a low CTE but high dielectric constant and dissipation factor. The inventors hereof have found that a desirable balance of properties can be achieved by combining the materials as directed herein.

For the purposes of the present invention the following terms are defined:

"Polymer matrix," "matrix polymer", and "polymer" are employed interchangeably to refer to the copolymer of monovinyl aromatic hydrocarbon and conjugated diene suitable for the practice of the present invention, except where otherwise noted.

The term "cross-linkable" refers to a copolymer of monovinyl aromatic hydrocarbon and conjugated diene which has not been cross-linked but which can be cross-linked in the presence of a free radical. The term "cross-linked" refers to a copolymer of monovinyl aromatic hydrocarbon and conjugated diene which has been cross-linked. A cross-linked polymer was once but is no longer cross-linkable. The term "cured" is employed to refer to a cross-linked polymer, and "uncured" to a polymer which is cross-linkable.

The term "woven fabric" refers to a fabric or a cloth prepared by well-known textile methods for interlacing yarns into a grid in which the yarns are arranged in a well defined sequence. Contemplated in the present invention are not just woven goods but also knit goods.

The term "non-woven fabric or paper" refers to a fiber sheet product which is prepared by a random or pseudo-random laying down of fibers. Such non-woven goods are well-known, including spun-bonded, spun-laced, flash spun non-woven fabrics. Papers are prepared by a process of employing short fibers in a random two-dimensional array as in the well known method for preparing cellulosic papers by an aqueous dispersion method. There is no clear distinction between papers and non-wovens in the art. The term "paper" is employed herein to refer to a short-fiber, fine denier non-woven structure isotropic in the plain having a relatively smooth surface and a thickness of 5–200 micrometers, preferably 10 to 100 micrometers. Papers are preferred for the practice of the invention.

The term "composite sheet" is employed herein to refer to a polymer-infused fabric or paper suitable for the practice of the invention. The term "dielectric sheet" or "dielectric layer" is used synonymously with "composite sheet."

The term "prepreg" is a term of art in the composites art referring to the composite sheet in the uncured or partially cured state. The "prepreg" represents an intermediate product which is a precursor to the final product as envisioned in the present invention which is the cross-linked composite.

The terms "metalized composite sheet" and "metalized dielectric layer" are employed synonymously to refer to a composite sheet of the invention having disposed upon one or both surfaces a layer of metal.

The terms "circuitized composite sheet" or "circuitized dielectric layer" are employed synonymously to refer to the composite sheet of the invention having disposed upon one or both surfaces thereof a patterned layer of metal which pattern represents conductive pathways for the electronic components to be mounted thereupon in a subsequent step.

The term "printed circuit board" refers to the circuitized dielectric layer having mounted upon it, or embedded within it, one or more electronic components which are interconnected by the conductive pathways disposed upon the composite sheet in the circuitized dielectric layer.

According to the process of the invention, one or more cross-linkable copolymers of monovinyl hydrocarbons and conjugated dienes, and at least one thermally activated free-radical initiator; are dissolved or dispersed into a volatile liquid and the resulting solution or dispersion in turn is infused into a woven or non-woven para-aramid or fiberglass fabric or paper to form a first embodiment "composite sheet" which because the cross-linkable polymer is not cross-linked, is known in the art as a "prepreg." The free-radical initiator may be added in a separate step, but that is less preferred. Alternatively, free-radicals may be formed as a result of exposure to ionizing radiation or electron beams but the use of free-radical initiators is greatly preferred. By whatever means, the prepreg so formed must be contacted with a source of free-radicals, preferably a free radical initiator, in order for cross-linking to be effected at a later stage in the process hereof.

In a second embodiment of the process of the invention, a metallic layer is adhesively contacted with the prepreg so formed. Preferably the metallic layer is electro-deposited or in the form of a metallic foil, and adhesion is effected with the application of elevated temperature and pressure to prepare a metalized dielectric layer. In a preferred embodiment, the elevated temperature also activates said free-radical initiator so that in situ cross-linking of said cross-linkable copolymer will occur during the metallization step. In this embodiment of the invention, it is preferred to metallize both sides of said composite prepreg.

In a third embodiment of the invention, a first free radical initiator activated during the metalization process is present at a concentration insufficient to effect complete cross-linking of said cross linkable polymer, and a second free radical initiator is present which is activated at a higher temperature than employed in the metalization step thereby leaving the composite sheet partially cured. In this embodiment it is preferred to effect metalization on only one side of said composite prepreg.

In a fourth embodiment of the present invention, said partially or wholly cured metallized dielectric layer, is subject to patterning according to any suitable method taught in the art, to form a circuitized dielectric layer. Preferably the techniques of photolithography are employed, but any suitable method may be used. Said circuitized dielectric layer may then be adhesively contacted with other layers to form a multi-layer structure, or it may be employed in a single layer. The patterned metallic layer in the circuitized dielectric layer provides electronically conductive pathways to interconnect the electronic circuit elements which will be disposed upon said circuitized dielectric layer at a later stage in the process.

When said composite sheet is fully cured during metalization, and most preferably, when both sides of said composite sheet have been metalized and circuitized, thereby forming a two-sided metalized dielectric layer, a multilayer structure may be formed by the application of an adhesive layer between two said metalized dielectric layers. Preferably the adhesive layer is an uncured composite sheet that has not been metalized.

When said composite sheet is partially cured, or uncured, during metalization, and when only one side thereof has been metalized, a multi-layer structure may be formed by simply contacting the uncured surface of one layer thereof with the circuitized surface of a second layer thereof.

Following preparation of a single or multi-layer circuitized dielectric layer curing is completed if necessary by exposure to a temperature sufficiently high to activate the residual free-radical initiator.

In still another embodiment of the present invention, the composite sheet may be fully cured prior to metalization. In this embodiment, metallization may be achieved by such well-known methods in the art as chemical vapor deposition, sputtering, and electro-plating. The metalized dielectric layer so prepared can then be circuitized. The circuitized layer can then be employed in a single layer or combined with other layers by the employment of a suitable adhesive layer between said metalized dielectric layers.

In yet a further embodiment of the present invention, printed circuit boards are prepared by mounting of localized electronic circuit components on the single or multi-layer circuitized dielectric layers herein produced, thereby producing an electronic device. While it is most common practice in the art to mount discrete packaged components onto single or multilayer circuitized dielectric layers after curing is completed, the present invention also contemplates the use of embedded circuit elements in circuitized dielectric layers including those which will, when fabrication is complete, reside on the interior of a multilayer printed circuit board.

The "uncured composite sheet" of the invention preferably contains one or more cross-linking coagents, as hereinbelow described. When cross-linking has been effected according to the methods herein, the coagents form diradical moieties which serve as links between cross-linking sites of the cross-linked polymer.

The cured or uncured composite sheet of the invention may further contain such other additives as may be deemed desirable in a specific application, and as are commonly employed in the art such as flame retardants, antioxidants, UV absorbers, inorganic fillers and the like.

In a preferred, embodiment of the invention, the polymeric matrix consists of a block copolymer of monovinyl aromatic hydrocarbons and conjugated dienes, said random copolymer being cross-linked in the final, printed circuit board product.

Suitable block copolymers for the invention are formed by sequential free radical addition polymerization according to the method of Holden et al, op.cit. or in the alternative the method of Tung et al, op.cit. which are herein incorporated by reference to the entirety. Suitable are block copolymers of the type A-B-A. A block copolymer of this sort will normally exhibit two glass transition temperatures in thermal analysis such as by differential scanning calorimetry (DSC) according to ASTM D3418.

In the A-B-A block copolymer suitable for the practice of the invention, "A" is a homopolymer radical formed by polymerizing monovinyl aromatic hydrocarbons such as but not limited to styrene, vinyl toluene, vinyl xylene, ethyl vinyl benzene, isopropylstyrene, ethylvinyl toluene, tert-butylstyrene or diethylstyrene, or a copolymer of at least 70% by weight of one or more of such mono-vinyl aromatic hydrocarbons and not more than 30% by weight of alpha-methylstyrene or esters of acrylic or methacrylic acid such as but not limited to ethyl acrylate, butylacrylate, or methylmethacrylate. The species of "A" preferred in the practice of the present invention is polystyrenic.

"B" is a diradical of the homopolymer formed by polymerizing conjugated aliphatic diene monomers include 1,3 butadiene, cyclopentadiene, 2-methyl, 1,3-butadiene as well as random copolymers of styrene and butadiene or random copolymers of butadiene and acrylonitrile. Preferred is the diradical formed by the polymerization of 1,3 butadiene.

Block "A" ranges in composition from 5 to 95% by weight of the A-B-A copolymer, and block "B," from 95 to 5% by weight. A preferred range for block "A" is 30 to 50% and of block "B," 70 to 50%. The weight average molecular weight for the copolymer may be in the range 5000 to 200 000, with 50,000–120,000 preferred. Molecular weight is important because it is a determining factor for both melt and solution viscosity. In styrene butadiene styrene copolymer, when the molecular weight is below 50,000, especially below 25,000, the matrix polymer exhibits undesirable tackiness (stickiness) making it very hard to handle, and the melt viscosity is sufficiently low that the polymer may flow out of the composite structure during the heated curing step. When the molecular weight is greater than 120,000, especially greater than 150,000, the concentration of solutions employed as described hereinbelow must be kept so low that repeated treatments of the reinforcement fibers is required in order to achieve the desired concentration of matrix polymer in the composite. The molecular weight range of 50,000–120,000 represents a useful trade-off among the competing demands in processing.

It will be apparent to one of skill in the art that some of the aliphatic diene monomers suitable for use in forming the "B" moiety of the A-B-A block copolymer suitable for use in the present invention can form polymers of more than one structure. For example, it is known in the art that butadiene may undergo 1,4 addition to produce a cis and/or trans structure and/or 1,2 addition to produce a pendant double bond. Any actual polymerization process will form a mixture of these structures. (see Kirk-Othmer, Encyclopedia of Chemical Technology, 3ed Edition, John Wiley & Sons, V-8 pp 612–621).

In another embodiment, a random copolymer is formed from components A and B by simultaneous, rather than sequential polymerization. The random copolymer so formed is characterized by a single glass transition temperature preferably above 50° C., and little if any crystallinity.

As is known in the art, the choice of catalyst, and the choice of emulsion or solution polymerization will influence the ratio of 1,2 adduct and 1,4 adduct in the product. When the 1,2 adduct is predominant, a high level of cross linking is achieved more readily than when the 1,4 adduct is predominant. One of skill in the art will recognize that when a coagent or cross-linking agent is employed, both grafting and cross-linking would be expected to take place so that the final product after the cross-linking is completed will exhibit both cross-links and grafts. The presence of grafts does not interfere with the achievement of satisfactory results in the practice of the invention.

Preferred for use in the present invention are para-aramid wovens, non-wovens and papers. Para-aramid papers are most preferred. Suitable para-aramids include poly(p-phenylene terephthalamide) (known as PPD-T); poly(p-phenylene p,p'-biphenyldicarboxamide); poly(p-phenylene 1,5-naphthalenedicarboxamide); poly(trans,trans-4,4'-dodecahydrobiphenylene terephthalamide);poly(trans-1,4-cinnamamide); poly(p-phenylene 4,8-quinolinedicarboxamide); poly(1,4-[2,2,2]-bicyclo-octylene terephthalamide); copoly(p-phenylene 4,4'-azoxybenzenedicarboxamide/terephthalamide); poly(-p-phenylene4,4'-trans-stilbenedicarboxamide) and poly(p-phenylene acetylenedicarboxamide).

The para-aramids suitable for the practice of the present invention are conveniently made by reacting suitable monomers in the presence of an amide type solvent by low temperature techniques as taught in U.S. Pat. No. 3,063,966 to Kwolek et al, which is incorporated herein by reference.

Para-aramids preferred for the present invention are homopolymers resulting from stoichiometric polymerization of p-phenylene diamine and terephthaloyl chloride and, also, copolymers resulting from incorporation of small amounts of other diamines with the p-phenylene diamine and of small amounts of other diacid chlorides with the terephthaloyl chloride. As a general rule, other diamines and other diacid chlorides can be used in amounts up to as much as about 30 mole percent of the p-phenylene diamine or the terephthaloyl chloride, or perhaps slightly higher, provided only that the other diamines and diacid chlorides have no reactive groups which interfere with the polymerization reaction. Also suitable are copolymers resulting from incorporation of other aromatic diamines and other aromatic diacid chlorides such as, for example, 2,6-naphthaloyl chloride or chloro- or dichloroterephthaloyl chloride; provided, only that the other aromatic diamines and aromatic diacid chlorides be present in amounts which permit preparation of anisotropic spin dopes. Preparation of p-para-aramids and processes for spinning fibers from the p-para-aramids are described in U.S. Pat. Nos. 3,869,429; 4,308,374; 4,698,414; and 5,459,231, which are incorporated herein by reference.

The para-aramids suitable for use in the present invention are spun according to the teachings of the art into fibers and optionally cut into short fibers called "floc". The fibers or floc so formed may be formed into woven or non-woven fabrics and papers.

Para-aramid papers are formed from a mixture of para-aramid short fibers (floc) and fibrids. The floc may be composed of para Para-aramid polymer or mixtures of para and meta para-aramid polymer. Fibrids used in para-aramid papers are nonrigid film-like particles and are formed from preferably meta-para-aramid polymer. Preparation of fibrids is taught in U.S. Pat. No. 3,756,908 with a general discussion of processes to be found in U.S. Pat. No. 2,999,788. Fibrids are used as a binder for the para-para-aramid flocs in paper making. A binder resin of other material is acceptable as a replacement for para-aramid fibrids provided that it, also, exhibit the properties required for printed circuit boards use. Other binder materials include but are not limited to epoxy resins, polyureas, vinyl acetates, polyureas, polyesters, polyacylonitriles, alkyd resins, and the like. Fibrids are preferred.

The concentration of floc and fibrids in the paper may range from 45 to 97% by weight floc and from 3 to 30% by weight fibrids. It is preferred that the para-para-aramid floc be poly(p-phenylene terephthalamide) and the meta para-aramid be poly(m-phenylene isophthalamide). Quartz or other inert materials may be used in forming the papers and may range from 0 to 35% by weight. All weight % for the paper composition are calculated based on the total sheet weight.

Preferred for use in the present invention is an para-aramid paper comprised of from 5 to 25 weight percent poly(m-phenylene-isophthalamide) fibrids and 75 to 95 weight percent p-para-aramid floc and having a basis weight of between 0.8 to 4.0 oz/yd2. Para-aramid papers prepared according to the methods in U.S. Pat. No. 5,910,231 are preferred for the practice of the present invention.

Also suitable for use in the present invention are fiberglass non-woven or woven fabrics, sheets or papers. Numerous such materials are in wide spread use in the art and available commercially from numerous sources.

In one embodiment of the process of the present invention, the woven or non-woven para-aramid fabric, sheet or paper is infused with at least one block copolymer of a monovinyl aromatic hydrocarbon and a conjugated diene. In order to achieve a desirable degree of homogeneity in a relatively short time it is highly preferred that the medium for effecting the infusion exhibit a desirably low viscosity in the range 50 to 5000 centipoise such as may be achieved by forming a solution of the block copolymer in a fugitive solvent. Suitable solvents include methyl ethyl ketone, acetone, toluene, xylene, dimethyl acetamide, N-methyl pyrrolidone, diglyme and the like.

In a preferred embodiment of the process of the invention a styrene-butadiene-styrene copolymer, such as Kraton® available from Shell Chemicals, Finaclear® or Finaprene® available from ATOFINA Petrochemicals, or Stereon® available from Firestone Polymers, is combined with toluene to form a solution 15 to 50% concentration by weight, preferably 20 to 35% by weight. Preferred polymers have a glass transition temperature well above the room temperature, usually above 40° C.

Infusion may be accomplished by any means known in the art whereby a non-woven or woven fabric, sheet, or paper may be contacted with a solution. The solution may be painted on or sprayed on. However, it is convenient and efficient to immerse the non-woven or woven fabric, sheet, or paper into an excess of the solution. The immersion time can vary from 1 to 30 seconds. A thin para-aramid sheet, such as a ca. 40–100 micrometer thickness sheet is preferred in the practice of the invention and readily undergoes wetting when treated with the solutions of the matrix polymer herein identified. Resin rheology and solids content are the main control mechanisms to determine resin pickup. Any convenient method for contacting the para-aramid paper or fabric with the polymer solution may be employed. Metering rods, also known as draw-down or applicator rods, can be used to help adjust the resin coating weight and uniformity. Many such designs exist. A satisfactory example is wire-wound Gardco applicator rods available from Paul Gardner Co., Pompano Beach, Fla. One of skill in the art will appreciate that a certain amount of trial and error is necessary in any specific combination of circumstances to fine tune the solids content and other variables. After the infusion is accomplished, the solvent is conveniently driven off by mild heating In order to achieve the desirable combination of properties provided by the present invention, the -para-aramid or fiberglass fibers in said woven or non-woven fabrics or papers occupy 20 to 60 volume-% of said composite sheet prepared according to the process of the invention must have a concentration of para-aramid or glass fibers in the range of 20–60 vol-%. In a preferred embodiment, the -para-aramid or fiberglass fibers in said woven or non-woven fabrics or papers occupy 30 to 50 volume-% of said composite sheet. Composite sheets having the specified concentrations provide a dissipation factor at 1 ghz under dry conditions of <0.02, in the preferred embodiment, <0.01. Dielectric constant is <4.0 at 1 ghz under dry conditions, in the preferred embodiment <3.2 for para-aramid fibers and less than 3.6 for glass fibers. The in-plane coefficient of thermal expansion is <16 ppm/° C. in the range of 50–150° C.; in the preferred embodiment, <13 ppm/° C.

The distribution of the imbibed resin is further determined during the cure cycle, in which the temperature, time, vacuum and pressure are regulated to achieve void free laminates. One of skill in the art will appreciate that the specific combination of variables necessary to achieve void free laminates will depend upon the particular composition employed. In one embodiment of the process of the invention it may be desirable to initiate partial or complete cross-linking coincident with the heating step which drives off the solvent.

Suitable free-radical initiators are those which are well-known in the art of addition polymerization. Peroxides commonly employed in the rubber industry can be used in this application. Suitable examples are benzoyl peroxide, dicumyl peroxide, tertiary butyl hydroperoxide, bis (tertiarybutylperoxyisopropyl) benzene and the like. The amount of peroxide in the matrix varies from 0.1% to 5% based upon the weight of the matrix polymer. The preferred range of peroxide is 1% to 4%.

It is also preferred to have a peroxide initiator that remains stable above room temperature, preferably at least 30° C. It is convenient when forming the metallic laminates and multi-layer printed circuit boards contemplated in the present invention to assemble said laminates and multi-layer printed circuit boards from the un-cured composites or "prepreg" of the present invention in order to enhance adhesion and interfacial contact. Once the laminate or multi-layer structures are assembled the cross-linking can be effected by heating the assembly so prepared to the activation temperature of the initiator.

It is preferred to use a peroxide initiator in the matrix that affords crosslinking of the matrix at temperatures in the range of 150° C. to 215° C. It is common in the art to select peroxide initiators according to the decomposition half-life as a function of temperature. The temperatures at which a peroxide has a half-life time of 10 h, 1 h and 0.1 h are reported in open literature. It is preferred to have a peroxide that has a half-life time of 0.1 h at temperatures in the range of 150° C. to 215° C.

It is preferred in the process of the invention to incorporate a so-called coagent to accelerate the cross-linking reaction and to increase the cross-linking density. It is found in the practice of the present invention that the coefficient of thermal expansion in a direction normal to the plane of the composite sheet of the invention depends strongly upon the cross-link density. In many practical applications for printed circuit boards a CTE normal to the plane of <400 ppm/° C. is required, with <200 ppm/° C. preferred. It is found in the practice of the present invention that to achieve the cross-link density needed to achieve those levels of CTE, coagent must be used. Numerous compounds are known in the art to be suitable as coagents in cross-linking reactions. The reactivity of the free radicals generated by the coagent affects the network formation in the composite sheet. Preferred are coagents that form less reactive free radicals—usually non-polar molecules that form more stable free radicals—increase the state of the cure thereby becoming part of the crosslinked polymer network. More reactive coagents are less preferred because they tend to undergo homopolymerization.

Coagents also show differences in volatility. One strong predictor of volatility is molecular weight. Excessively volatile coagents may evaporate away before the thermally initiated cross-linking of the matrix components is effected. Volatility may be particularly severe in the fabrication of composite sheets in which high temperature and vacuum are employed in the processing. Most preferred are coagents that exhibit low volatility at the temperature required for initator activation. For example, a preferred coagent for the process of the present invention exhibits a boiling point greater than 150° C. at one atmosphere pressure. Preferred coagents contain two or more unsaturated carbon-carbon bonds. Preferred coagents include but are not limited to triallyl cyanurate, triallyl isocyanurate, divinyl benzene, trivinyl cyclohexane, diallyl phthalate, triallyl trimellitate, triallyl trimesate, ethylene glycol dimethacrylate, butylene glycol dimethacrylate, a trifunctional methacrylate such as SR 9009 and tetrabromobisphenol A diallyl ether. When cross-linking is effected, the coagent will be present in the cross-linked polymer in the form of a diradical moiety derived from said coagents. Preferred coagulants are triallyl cyanurate and trifunctional methacrylate such as triallyl trimellitate. Suitable concentration of coagent is 1% to 40% by weight based upon the weight of the copolymer, with 2% to 25% preferred. The coagent, like the initiator, is preferably introduced into the solution of the polymer prior to the infusion thereof into the non-woven or woven fabric, sheet, or paper.

The degree of cross-linking may be varied by the concentration and choice of initiator and/or coagent, as well as by variations in cure temperature, as hereinbelow exemplified. Styrene-butadiene-styrene block copolymer, a preferred matrix polymer, is difficult to crosslink. It has been found in the practice of the process of the invention that the degree of solvent swelling observed after cross-linking is consistent with a moderate degree of cross-linking. The effect of crosslinking on $T_g$ is very little, but the coefficient of thermal expansion (CTE), especially above Tg, is very sensitive to the extent of cross-linking at low levels of crosslinking. As the degree of cross-linking increases, CTE decreases considerably. In applications where a low through-thickness (z-direction) CTE are needed, a high degree of cross-linking is desired.

One of skill in the art will appreciate that the composite according to the invention may incorporate such other additives as commonly employed in the art to impart some desirable property such as pigmentation, ultra-violet resistance, improved surface adhesion, flame retardance or tack reduction in the prepreg. Improved adhesion and flame retardance are of particular interest in printed circuit boards.

Typically, composites of the present invention will contain flame retardant additives containing bromine, phosphorus or melamine. Suitable bromine additives include but are not limited to decabromodiphenyl ether, tetradecabromodiphenoxy benzene, and decabromodiphenyl methane. These compounds are used alone or in combination with antimony oxide. Suitable phosphorus based additives include but are not limited to tetraphenylbisphenol A diphosphate, tetraphenyl resorcinol diphosphate. Suitable melamine based compounds include but are not limited to melamine cyanurate, melamine polyphosphate, and melamine pyrophosphate.

Inorganic particulate materials may be added to the matrix dispersion to reduce the tackiness of the prepreg to facilitate handling or for other purposes. The composition of the particulate in the matrix may be in the range 0 to 30%, or preferably in the range 10–20%, by volume. Examples of particulate materials include titanium oxide, boron nitride, barium titanate, strontium titanate, magnesium, corundum, wollastonite, calcium carbonate, silica including fused amorphous or fumed silica etc. The particulate also may be in the form of hollow spheres. Additionally, the particulate may be also surface modified with silane coupling agents to provide good adhesion with the matrix resin.

When a desired additive is not soluble in the solvent employed in the process of the invention, it is preferred to created a dispersion of the additive in the solvent utilizing powders having an average particle size of less than ten micrometers, preferably less than 2 micrometers.

If needed, one or more adhesion promoters may be used to improve the interface between the matrix and the para-aramid sheet, and also to improve adhesion with copper. Any organic compound that contains a polar functional group (epoxy group works well) and a vinyl or allyl group that can undergo crosslinking reactions with the matrix can be used as an adhesion promoter. Suitable adhesion promoters include but are not limited to allyl glycidyl ether, glycidyl methacrylate. In the practice of the present invention, adhesion promoters range in concentration from 0 to 10% by weight, preferably 0–2% by weight, versus the weight of the copolymer being employed. However, excellent results can be obtained without the use of adhesion promoters, as in Examples 5–7 hereinbelow. By proper selection of a coagent which adheres well to both reinforcing fiber and metal foil, the separate adhesion promoter can be eliminated.

Other additives present in the printed circuit board of the invention are such materials as commonly employed in the fabrication of printed circuit boards such as conductive pastes.

In one embodiment of the present invention a composite is formed by infusing a solution comprising a free radical initiator and a polymeric matrix consisting essentially of one or more block copolymers of the form A-B-A as hereinabove described into a substrate comprising a woven or non-woven para-aramid fabric or paper, as hereinabove described, said solution also comprising such additives and process aids as are commonly employed in the art to improve adhesion, expedite cross-linking, improve flammability resistance, color or opacity, decrease susceptibility to UV degradation and the like. After infusion, the solvent is driven off. In one embodiment, the composite so formed is heated to a temperature at which the free-radical initiator decomposes to initiate a cross-linking reaction. In an alternative, and preferred embodiment, cross-linking is not effected until after the further embodiments of the invention set forth immediately hereinbelow are realized.

Depending upon the specific polymeric matrix employed, such as, for example a random copolymer, it may be desirable to partially cure the composite so formed in order to improve handling and processing performance before employing it in the subsequent steps following. In a composition which is to be partially cured (so called B-stage as known in the art), it is convenient to employ two initiators, a small amount of a first initiator and a larger amount of a second initiator, the first initiator becoming activated at a temperature lower than that at which the second initiator is activated.

In a further embodiment, the process of the invention further comprises adhesively contacting said composite sheet with a metallic layer either before or after cross-linking is effected. Said composite sheet is adhesively contacted with a metallic layer on one or both sides, preferably with a metallic foil, typically a copper foil, in a laminating step. In a preferred embodiment in the practice of the invention, copper clad laminates are made by pressing the composite of the invention with an electro-deposited copper foil. While making copper clad laminates, the matrix impregnated para-aramid sheet is placed in between two copper films. Normally, the copper foil has a smooth and a rough side. The rougher side of copper film is facing the coated para-aramid sheet. Then, the whole stack is cured in a platen press under pressure. The initial stage of the cure cycle is selected to maximize the resin flow onto the rougher side of the copper film. Vacuum and pressure helps the resin flow in the rougher side of the copper foil. Minimum crosslinking should take place at this temperature because the crosslinking increases the viscosity of the resin and reduces the resin flow. In an especially preferred embodiment, curing occurs at a temperature above that needed to cause some degree of melt flow.

The foregoing methods may be modified to form multi-layer printed circuit boards.

Alternative methods, such as are known in the art for depositing thin coatings on substrates, may be employed to good effect in the present invention. Among these are vapor phase deposition of copper on the composite substrate of the invention, and electroless plating.

In a still further embodiment said metallic laminate is subject to treatment according to the art of photolithography to form a printed circuit board having electrically conductive metallic pathways disposed upon the composite surface in a manner intended to provide interconnection among electronic devices mounted thereupon. In one of several such methods, the metallic surface is coated with a photopolymer. The thus coated surface is exposed to illumination from a source, which illumination passes through a so-called photomask thereby casting a negative image upon the coated surface inducing polymerization in the areas where the light has struck. The illuminated surface is then subject to treatment with solvents which wash away the unpolymerized coating. The thus exposed metal is then subject to chemical etching, leaving only that metal behind which is protected by the in situ polymerized coating. In a final step, the coating is removed and the final printed circuit board remains. The foregoing is only an outline of the multi-step manufacturing process in common commercial use. There are many embodiment variations, and alternative means of making them, involving multilayers, microvias and through holes, positive resists and negative resists, and so on as is well-known in the art. Other methods use imprint or indentation technologies.

One particularly preferred embodiment of the invention comprisies a printed circuit board as herein described wherein said woven or non-woven para-aramid or fiberglass fabrics or papers occupy 30 to 50 volume-% of said composite sheet, said composite sheet further comprising crosslinks in the form of diradical moieties derived from one or more coagents selected from the group consisting of triallyl cyanurate, triallyl isocyanurate, divinyl benzene, trivinyl cyclohexane, diallyl phthalate, triallyl trimellitate, triallyl trimesate, ethylene glycol dimethacrylate, butylene glycol dimethacrylate, trifunctional methacrylates, and tetrabromo-bisphenol A diallyl ether; wherein the woven or non-woven para-aramid fabric or paper is para-aramid paper; and, wherein said copolymer is a styrene-butadiene-styrene block copolymer.

The invention is further illustrated in the following specific embodiments.

EXAMPLES

Definitions

In the below examples, the following abbreviations are used:

"Dk" designates dielectric constant.

"Df" designates dissipation factor.

"CTE" designates coefficient of thermal expansion.

"Tg" designates glass transition temperature.

"TMA" designates a Thermal Mechanical Analyzer.

Test Methods
A. Dielectric Properties

Two methods were used to determine the dielectric properties of the specimen. The main differences in the two methods were the electromagnetic frequencies of the measurements.

Method 1 (Used for Examples 1–11)

Dielectric constant and electrical dissipation factor were determined by subjecting a planar specimen to 5.4 GHz microwave radiation oscillating in the TE011 mode in a resonant cavity. The cavity was a hollow right-circular cylinder made of aluminum, with 0.5" wall thickness and 0.25"-thick end caps, and interior dimensions of 2.75" diameter and 4.75" height. A narrow slot perforating the cavity perpendicular to the cylinder axis and halfway between the ends allowed insertion of flat-sheet dielectric samples of size 3.25"×5", and up to 0.1" thickness. Two small loop antennas, positioned in the upper and lower halves of the cylinder, permit a microwave signal to be radiated into the cavity, pass through the sample under test, and then be detected by a microwave network analyzer (Model 8753 network analyzer from Agilent Technologies). By comparing the frequency and quality-factor (Q) of the TE011 resonance with the sample in place to that of the empty cavity, the dielectric constant and dissipation factor of the material was calculated from the known thickness of the sample using a mathematical analysis similar to that in N. Damaskos and B. Kelsall, "Measuring Dielectric Constants of Low Loss Materials using a Broadband Cavity Technique" *Microwave Journal*, pp 140–149, September 1995.

Before dielectric measurements were performed, specimens were dried at 50° C. under vacuum overnight and then, where indicated, were conditioned in a chamber maintained at 22° C. and 80% RH for 24 hours.

Method 2 (Used for Examples 12–17

The dielectric properties of the test material were measured in a fashion similar to Method 1 but using a Model 08 rectangular microwave cavity sold by Damaskos, Inc. of Concordville, Pa. This cavity has a slot at its midplane to accommodate a planar test specimen. The internal dimensions of the cavity are 20.32 cm×3.81 cm. The cavity has a fundamental frequency of approximately 815 MHz. Properties at discrete frequencies up to 4.6 GHz were measured using harmonic modes.

Before dielectric measurements were performed, specimens were dried at 50° C. under vacuum overnight and then tested immediately under ambient room conditions. Where indicated, the specimen were then also conditioned in a chamber maintained at 85° C. and 85% RH for 24 hours and then tested immediately under ambient room conditions.

B. Thermomechanical Properties

The glass transition temperature $T_g$ and coefficient of thermal expansion (CTE) of the laminates and matrix were determined using a Thermal Mechanical Analyzer. The IPC-TM-650 Number 2.4.24.5 test method was used. Both in-plane (x,y direction) and through-thickness (z-direction) CTE were measured when indicated. In Examples 1–7, CTE's were measured using single plies of specimen (IPC-TM-650 Number 2.4.24.5 Method B). Multi-ply specimens (>1 mm thick) were used for CTE normal to the plane or z-CTE measurements (IPC-TM-650 Number 2.4.24.5 Method A).

One of skill in the art will appreciate that the determination of CTE depends upon sample configuration. Because of this effect, the results in the Examples following for the para-aramid non-woven fabric or paper were not directly comparable to the results for the woven fiberglass composites. Non-woven fabrics and papers were isotropic in the plane. As a result, a single layer construction can be tested without concern for the direction of cutting when preparing the sample. Woven fabrics however were non-isotropic in the plane. CTE results obtained by testing a single layer woven fabric will depend heavily on the direction of cutting the sample, as was the case in Examples 8–11, hereinbelow. To achieve direction-insensitive results in a woven fabric requires the preparation of at least a four layer, preferably an eight-layer test specimen. A four layer symmetrical balanced laminate will consist of specimens laminated together at the following angles: 0 deg./45 deg./45 deg./0 deg.

Solder bath performance was tested at 288° C. for 3 minutes using the method IPC-TM-650, Number 2.4.23. The criterion for passing the test was the absence of visually detectable blisters or delamination between the copper foil and the laminate at the conclusion of the test.

Materials

Finaclear 530 styrene-butadiene block copolymer resin available from ATOFINA was employed. The styrene content was about 77% and the melt flow. Index was 11 g/10 min. under a 5 kg at 200° C. The butadiene monomer was present both in block and random sequences in the copolymer.

Stereon 857 is a styrene-butadiene block copolymer available from Firestone Polymers. The bound styrene of the copolymer is 44%. The vinyl content of the copolymer is 57%. The melt flow index is 13.0 g/10 min, under a 5 kg load at 200° C.

Thermount® 2N710, a 51 micrometer thick non-woven para-aramid sheet with a basis weight of 30.9 g/m2 available from the DuPont Company, Wilmington Del., was employed.

Example 1

Compositions I and II, as shown in Table 1 were prepared by dissolving the indicated amounts of the indicated ingredients into 170 ml of methyl ethyl ketone. Benzoyl peroxide and trivinyl cyclohexane obtained from Aldrich were used in this example. Methyl ethyl ketone, ACS reagent, also obtained from Aldrich was used as the solvent. Luperox F was an ATOFINA trademark for *bis (tert.butylperoxyisopropyl)benzene initiator.

TABLE 1

|  | Composition I | Composition II |
| --- | --- | --- |
| Styrene-butadiene copolymer (g) | 30 | 30 |
| Trivinyl cylcohexane (g) | 1.5 | 1.5 |
| Benzoyl peroxide (g) | 0.9 |  |
| Luperox F* |  | 0.3 |

Each of said solutions was stirred at room temperature until it became clear. The solvent was evaporated under vacuum in a rotary evaporator followed by heating at 60° C. in a vacuum oven overnight.

The residue of Composition I remaining after solvent evaporation was cured in a hydraulic platen press at 122° C. for one hour under 100 psi pressure. Then the temperature was increased to 280° C. at 5° C./minute, and held at that temperature for two minutes under pressure. The press was then cooled to less than 100° C. under pressure and the specimen removed.

The residue of Composition II was cured in a manner similar to that of Composition I except that the initial curing temperature was 170° C.

Thus cured specimens were sheets having a thickness of ca. 450 micrometers.

The resulting properties of the thus prepared specimens were shown in Table 2. Coefficient of thermal expansion (CTE) was determined according to test method IPC-TM-650, Number 2.4.24.5 at temperatures of −50° C. to 280° C. $T_g$ was determined by TMA as stated above.

TABLE 2

|  | Composition I | Composition II |
| --- | --- | --- |
| Dk (5.4 GHz) |  |  |
| dry | 2.526 | 2.550 |
| 80% RH | 2.526 | 2.564 |
| Df (5.4 GHz) |  |  |
| dry | 0.0024 | 0.0065 |

TABLE 2-continued

|  | Composition I | Composition II |
| --- | --- | --- |
| 80% RH | 0.0035 | 0.0073 |
| Tg | 86 | 101 |
| CTE (ppm/° C.) |  |  |
| below Tg | 69.8 | 75.7 |
| above Tg | 684 | 154 |

Composition I displays a higher amount of expansion above the glass transition temperature of the matrix. The composition II displays approximately the same amount of expansion below the glass transition temperature and a much lower expansion above the Tg of the cured matrix.

Comparative Example 1

A custom blend of epoxy resins, Epon Custom Solution 373 and Eponol Resin 55-BH-30, specially formulated for the printed circuit board laminates was used as the matrix resin. Both resins were obtained from Resolution Performance Products, Houston, Tex. 2-Methylimidazole, obtained from Pacific Anchor Chemical Corporation, Los Angels, Calif., was used as a catalyst for curing the epoxy resin. The catalyst was added to the epoxy solution at the recommended concentration level prior to prepregging. Para-aramid sheet 2N710 was dipped in the combined matrix solution and pulled through a narrow gap between a pair of metering bars (Wire-wound Gardco applicator rods, size 30, available from Paul Gardner Co., Pompano Beach, Fla.). The amount of matrix pick-up was about 55 weight percent after the solvent removal and B-staging to form a solid non-flowing non-sticky easy to handle sheet.

The B-stage prepreg was cured in a platen press using the following conditions; 1 minute at 93° C. under 8 psi pressure, 40 minutes at 177° C. under 600 psi pressure, 30 minutes at 204° C. under 200 psi pressure. Finally the press was cooled rapidly by water circulation to temperature below 93° F. under pressure. Dielectric constant and dissipation factor were determined at 5.4 ghz; results are shown in Table 3.

TABLE 3

|  | Dry | 80% RH |
| --- | --- | --- |
| Dk | 2.970 | 3.299 |
| Df | 0.0181 | 0.0446 |

Examples 2–4

The following matrix solutions were prepared by dissolving the matrix components in suitable solvent.

Matrix I: 30 g of styrene-butadiene copolymer, 1.5 g of triallyl isocynaurate, 0.6 g of allyl glycidyl ether and 0.3 g of Luperox F were added to 180 ml of methyl ethyl ketone and stirred at room temperature until the solution was clear.

Matrix II: 30 g of styrene-butadiene copolymer, 3.0 g of trivinyl cyclohexane, 0.6 g of allyl glycidyl ether and 0.3 g of Luperox F were added to 180 ml of methyl ethyl ketone and stirred at room temperature until the solution was clear.

Matrix III: 30 g of styrene-butadiene copolymer, 1.5 g of trivinyl cyclohexane, 0.3 g of Luperox F were added to 180 ml of methyl ethyl ketone and stirred at room temperature until the solution was clear. Then 3.2 g of Melapure 200

(obtained from Melapure, Saddle Brook, N.J.) was added to the solution and stirred well.

Properties of the Matrix solutions thus prepared were determined according to the procedures followed in Example 1. Results are shown in Table 4. Dielectric properties were measured at approximately 5.4 GHz.

TABLE 4

| Matrix: | Matrix I | Matrix II | Matrix III |
|---|---|---|---|
| Dk (dry) | | 2.548 | 2.825 |
| Dk (80% RH) | | 2.556 | 2.904 |
| Df (dry) | | 0.0034 | 0.0117 |
| Df (80% RH) | | 0.0038 | 0.0237 |

Separate pieces of Thermount® 2N710 were immersed in the respective matrix solutions for 10–15 seconds allowed to drain out the excess solution. The thus formed composite sheet was dried in the laboratory hood for 30 minutes and then in an air circulating oven maintained at 80° C. for one hour.

The thus prepared prepreg composite was cured in a hydraulic platen press by heating at 170° C. for one hour under 100 psi pressure. The temperature of the press was increased to 280° C. at 5° C./minute heating rate, and held at this temperature for two minutes under 100 psi pressure. Then the press was cooled rapidly to below 100° C. under pressure.

Thus cured composite sheets formed with the Matrix Solutions I, II, and III were herein designated Composites I, II, and III respectively. Results were shown in Table 5. Weight-% pickup refers to the percentage weight increase between the respective composite sheet and the Thermount® 2N710 starting material before treatment with the matrix solution. Dielectric properties were measured as in Example 1. Results are shown in Table 5.

TABLE 5

| | Composite I | Composite II | Composite III |
|---|---|---|---|
| Wt. % pickup | 56.5 | 60.6 | 55.6 |
| Dk (dry) | 2.921 | 2.949 | 2.958 |
| Dk (80% RH) | 3.085 | 3.095 | 3.143 |
| Df (dry) | 0.0039 | 0.0040 | 0.0043 |
| Df (80% RH) | 0.0159 | 0.0150 | 0.0178 |
| Solder float | Not tested | pass | Pass |
| CTE (ppm/° C.) | Not tested | 11.8 | Not Tested |

Examples 5–7

In Examples 5–7, Thermount® 2N710 was saturated with an MEK (methyl ethyl ketone) resin solution composition as indicated, following the procedures of Examples 1–4. Most of the MEK solvent was evaporated at room temperature. The resin saturated sheet was then placed in a vacuum bag and was thermally cured. The cured composite was removed from the bag and tested for Dielectric Constant (Dk) and Dissipation Factor (Df) as in Example 1. Another similarly cured composite was tested for Coefficient of Thermal Expansion (CTE) from room temperature to above the glass transition temperature using tension mode TMA.

Example 5

The resin solution composition was:

| | |
|---|---|
| Butadiene (predominately 1,2 addition) styrene random copolymer (Ricon ® 100 from Sartomer) | 20.00 gm |
| Trifunctional methacrylate monomer (SR 9009 from Sartomer) | 1.00 gm |
| α,α'-bis(t-butylperoxy)diisopropyl-benzene (Luperox F form Atofina) | 0.20 gm |
| methyl ethyl ketone (MEK) solvent | 20 ml |

The thermal cure conditions were: 130° C. for 20 minutes, 150° C. for 20 minutes, 180° C. for 40 minutes, 200° C. for 30 minutes and 230° C. for 30 minutes. The temperature rate rise was about 5° C./minute.

The laminate properties were:

From 25° C. to 257° C., the average CTE was 9 ppm/° C.

Electrical Properties (5.4 GHz):

| Conditions (% RH/T° C.) | Dk | Df |
|---|---|---|
| DRY/22 | 3.095 | 0.0064 |
| 80/22 | 3.335 | 0.0252 |

Example 6

The resin solution composition was:

| | |
|---|---|
| Poly styrene-butadiene predominately 1,4 addition) (Finaclear ® from Atofina) | 20.00 gm |
| Butadiene (predominately 1,2 addition) styrene random copolymer (Ricon ® 100 from Sartomer) | 6.00 gm |
| Trifunctional methacrylate monomer (SR 9009 from Sartomer) | 1.30 gm |
| α,α'-bis(t-butylperoxy)diisopropyl-benzene (Luperox F form Atofina) | 0.40 gm |
| methyl ethyl ketone (MEK) solvent | 60 ml |

The thermal cure conditions were: 180° C. for 40 minutes and 220° C. for 30 minutes. The temperature rate rise was about 50° C./minute.

The laminate properties were:

From 28° C. to 300° C., the average CTE=5 ppm/° C.

Electrical Properties (5.4 GHz):

| Conditions (% RH/T° C.C) | Dk | Df |
|---|---|---|
| DRY/22 | 3.142 | 0.0037 |
| 80/22 | 2.969 | 0.0174 |

Example 7

The resin solution composition was:

| | |
|---|---|
| Poly styrene-butadiene (predominately 1,4 addition) (Finaclear ® from Atofina) | 20.00 gm |
| Polybutadiene dimethyacrylate (CN-301 from Sartomer) | 6.00 gm |

| | |
|---|---|
| Trifunctional methacrylate monomer (SR 9009 from Sartomer) | 1.30 gm |
| α,α'-bis(t-butylperoxy)diisopropyl-benzene (Luperox F form Atofina) | 0.40 gm |
| methyl ethyl ketone (MEK) solvent | 70 ml |

The thermal cure conditions were: 180° C. for 40 minutes and 220° C. for 30 minutes. The temperature rate rise was about 5° C./minute.

The laminate properties were:

From 40° C. to 95° C., the average CTE was 10.6 ppm/° C., and from 95° C. to 300° C., the average CTE was −2.2 ppm/° C.

Electrical Properties (5.4 GHz)

| Conditions (% RH/T° C.) | Dk | Df |
|---|---|---|
| DRY/22 | 2.742 | 0.0044 |
| 80/22 | 2.887 | 0.0161 |

Examples 8–11

A woven fiberglass fabric was saturated with a resin solution composition following the procedures or Examples 1–4. Most of the low boiling solvent was evaporated at room temperature. The resin saturated sheet was then placed in a vacuum bag and was thermally cured as indicated. The cured laminate was removed from the bag and tested for Dielectric Constant (Dk) and Dissipation Factor (Df) according to the method of Example 1.

Example 8

Woven Fiberglass fabric style 1280 (from Hexcel Schwebel) was used with the following resin solution composition.

| | |
|---|---|
| Poly styrene-butadiene (Finaclear ® 530 from Atofina) | 180.00 gm |
| Trivinylcyclohexane (From Aldrich) | 9.00 gm |
| α,α'-bis(t-butylperoxy)diisopropyl-benzene (Luperox F form Atofina) | 1.80 gm |
| Melapur 200 (from DSM) | 18.9 gm |
| methyl ethyl ketone (MEK) (solvent) | 550 ml |

The thermal cure conditions were: 180° C. for 60 minutes and 220° C. for 30 minutes. The temperature rate rise was about 5° C./minute.

From 25° C. to 300° C., the average CTE=36.6 ppm/° C. The laminate electrical properties (5.4 GHz) were:

| Conditions (% RH/T° F.) | Dk | Df |
|---|---|---|
| DRY/72.4 | 3.309 | 0.0035 |
| 80/72.4 | 3.320 | 0.0068 |

Example 9

Woven Fiberglass fabric style 1280 (from Hexcel Schwebel) was used with the following resin solution composition was.

| | |
|---|---|
| Poly styrene-butadiene (Finaclear ® 530 from Atofina) | 180.00 gm |
| Triallyl isocyanurate (From Aldrich) | 18.00 gm |
| α,α'-bis(t-butylperoxy)diisopropyl-benzene (Luperox F form Atofina) | 1.80 gm |
| Pentabromophenyl ether (From Aldrich) | 18.9 gm |
| Antimony (III) Oxide (From Aldrich) | 7.92 gm |
| Toluene (solvent) | 525 ml |

The thermal cure conditions were: 180° C. for 60 minutes and 220° C. for 30 minutes. The temperature rate rise was about 5° C./minute.

From 25° C. to 300° C., the average CTE=61.0 ppm/° C. The laminate electrical properties (5.4 GHz) were:

| Conditions (% RH/T° F.) | Dk | Df |
|---|---|---|
| DRY/72.4 | 3.354 | 0.0029 |
| 80/72.4 | 3.382 | 0.006 |

Example 10

Woven Fiberglass fabric style 106 (from Hexcel Schwebel) was used with the following resin solution composition was.

| | |
|---|---|
| Poly styrene-butadiene (Finaclear ® 530 from Atofina) | 180.00 gm |
| Trivinylcyclohexane (From Aldrich) | 9.00 gm |
| α,α'-bis(t-butylperoxy)diisopropyl-benzene (Luperox F form Atofina) | 1.80 gm |
| Melapur 200 (from DSM) | 18.9 gm |
| methyl ethyl ketone (MEK) (solvent) | 550 ml |

The thermal cure conditions were: 180° C. for 60 minutes and 220° C. for 30 minutes. The temperature rate rise was about 5° C./minute.

From 25° C. to 300° C., the average CTE=41.4 ppm/° C. The laminate electrical properties (5.4 GHz) were:

| Conditions (% RH/T° F.) | Dk | Df |
|---|---|---|
| DRY/72.4 | 3.022 | 0.0042 |
| 80/72.4 | 3.128 | 0.0227 |

Example 11

Woven Fiberglass fabric style 106 (from Hexcel Schwebel) was used with the following resin solution composition was.

| | |
|---|---|
| Poly styrene-butadiene (Finaclear ® 530 from Atofina) | 180.00 gm |
| Triallyl isocyanurate (From Aldrich) | 18.00 gm |
| α,α'-bis(t-butylperoxy)diisopropyl-benzene (Luperox F form Atofina) | 1.80 gm |
| Pentabromophenyl ether (From Aldrich) | 18.9 gm |
| Antimony (III) Oxide (From Aldrich) | 7.92 gm |
| Toluene (solvent) | 525 ml |

The thermal cure conditions were: 180° C. for 60 minutes and 220° C. for 30 minutes. The temperature rate rise was about 5° C./minute.

From 25° C. to 300° C., the average CTE=74.5 ppm/° C. The laminate electrical properties (5.4 GHz) were:

| Conditions (% RH/T° F.) | Dk | Df |
|---|---|---|
| DRY/72.4 | 3.006 | 0.0036 |
| 80/72.4 | 3.109 | 0.0191 |

Example 12

126 g of Stereon 857 and 27 g of Ricon 100 (both styrene-butadiene copolymers) and 27 g of SR 9009, a trifunctional methacrylate coagent available from Sartomer (Exton, Pa.) were dissolved in 400 ml of toluene at room temperature using a mechanical stirrer. To this clear solution 34.38 g Saytex 120, a brominated flame retardant available from Great Lakes Chemical, 8.45 g of antimony oxide and 39.3 g of silica R7200, a product of Deguessa, were added and mixed thoroughly. 100 ml toluene was added to this dispersion and then the dispersion was homogenized for three minutes using a high shear Siverson Homogenizer. 3.6 g of Luperox F, a product of AtoFina, was added to this dispersion and stirred for 30 minutes.

Thermount 2N710 sheets (5 inches width and 60 inches long) were impregnated with resin similar to procedure in Comparative Example 1. The wet prepreg was left in the laboratory hood overnight for drying. The matrix pick-up was 57.5% by weight of the prepreg. The dried prepreg was cut into 4×5" pieces for making multiply laminate.

The prepregs were stacked and cured in a hydraulic platten press by heating at 145° C. for fifteen minutes, at 170° C. for one hour, at 240° C. for one hour and at 290° C. for ten minutes, all under 200 psi pressure.

Dielectric properties were determined according to method 2 as outlined hereinabove. Test results are shown in Table 6.

Example 13

54 g of Poly styrene-butadiene (Stereon 857 from Firestone Polymers), 27 g of Butadiene-styrene random copolymer grafted with divinylbenzene (Ricon 257 from Sartomer) and 9 g of a trifunctional methacrylate coagent (SR 9009 from Sartomer—Exton, Pa.) were dissolved in 275 ml of toluene. A 17.3 g of a brominated flame retardant (Saytex 120 from Great Lakes Chemical) and 4.2 g of antimony (III) oxide, were added and homogenized for two minutes using a high shear Homogenizer. 1.8 g of ($\alpha,\alpha'$-bis (t-butylperoxy)diisopropyl-benzene (Luperox F form Atofina) was added to the dispersion and stirred to give a uniform mixture.

Thermount® 2N710 sheets (5 inches width and 60 inches long) were impregnated with resin similar to procedure in Comparative Example 1. The wet prepreg was left in the laboratory hood overnight for drying. The matrix pick-up was 54% by weight of the prepreg.

The sheets of the resin impregnated Thermount® were stacked and cured in a vacuum press for 15 min. at 100° C., one hour at 170° C. followed by two hour at 220° C. all under 400 psi pressure. The laminate had a z-direction CTE of 186 ppm/° C. between 50 and 150° C.

Example 14

36 g of Poly styrene-butadiene (Stereon 857 from Firestone Polymers), 12 g of Butadiene-styrene random copolymer (Ricon 100 from Sartomer) and 12 g of Triallyloxy Triazine were dissolved in 200 ml of MEK (methylethylketone). A 10.7 g of a brominated flame retardant (Saytex 120 from Great Lakes Chemical) and 2.2 g of antimony (III) oxide, were added and mixed in. 1.2 g of $\alpha,\alpha'$-bis(t-butylperoxy)diisopropyl-benzene (Luperox F form Atofina) is added to the dispersion and stirred to give a uniform mixture.

Thermount® 2N710 sheets (5 inches width and 60 inches long) were impregnated with resin similar to procedure in Comparative Example 1. The wet prepreg was left in the laboratory hood overnight for drying. The matrix pick-up was 50% by weight of the prepreg.

The sheets of the resin impregnated Thermount® were stacked and cured in a vacuum bag in a press for two hour at 180° C. followed by two hour at 240° C. and 10 min. at 290° C. The laminate had a z-direction CTE of 113 ppm between 50 and 150° C., an x-direction CTE of 7.6 ppm/° C. and a y-direction CTE of 7.1 ppm/° C.

The laminate Dk and Df were measured at different frequencies and are shown in the table bellow:

| MHz | 815 | 1279 | 1891 | 2548 | 3221 | 3903 | 4590 | 5279 |
|---|---|---|---|---|---|---|---|---|
| Dk | 3.143 | 3.140 | 3.138 | 3.133 | 3.131 | 3.132 | 3.127 | 3.126 |
| Df | 0.0049 | 0.0046 | 0.0046 | 0.0048 | 0.0045 | 0.0047 | 0.0050 | 0.0046 |

Example 15

180 g of Finaclear 530, a styrene-butadiene copolymer, 14.5 g of triallyl isocyanurate and 3.6 g of allyglycidyl ether were dissolved in 400 ml of toluene. To this solution 37.75 g of Saytex 120 and 9.22 g of antimony oxide were added and stirred well. 50 ml toluene was added to this dispersion and the dispersion was homogenized for three minutes using a Silverson Homogenizer. 1.8 g of Luperox F was added to the dispersion and stirred for 30 minutes at room temperature.

Thermount® 2N170 sheet was prepregged with this dispersion as described in Comparative Example 1. The matrix pick-up was 56% by weight of the prepreg. A multiply laminate was made by curing in a platten press by preassing at 145° C. for fifteen minutes, at 170° C. for one hour and at 290° C. for ten minutes, all under 200 psi pressure.

The properties of the laminates from Examples 12 and 15 are summarized in table 6.

TABLE 6

| Laminate properties | Example 12 | Example 15 |
|---|---|---|
| Dielectric constant (2.54 GHZ) | | |
| Dry | 2.87 | 2.94 |
| 85° C./85% RH for 1 day | 2.96 | 3.06 |
| Dissipation factor (2.54 GHz) | | |
| dry | 0.0038 | 0.0041 |
| 85° C./85% RH for 1 day | 0.0094 | 0.0115 |

TABLE 6-continued

| Laminate properties | Example 12 | Example 15 |
|---|---|---|
| Moisture absorption (%) | — | 0.25 |
| Peel strength (lb/in) | 5.5 | 3.6 |
| CTE (ppm/° C., 50–150° C.) | | |
| x | 12.9 | 4.7 |
| y | 9.2 | 1.7 |
| z | 152 | 328 |
| UL94 | V-O | V-O |

Example 16

A style 1280 woven E-glass fabric (Hexcel Schwebel) was impregnated with a resin solution with the same composition as in Example 12 except the weight % of solids in the solution was adjusted to 32%. The resin impregnation procedure was similar to Comparative Example 1 except that Size 18 wire-wound Gardco applicator rods were used instead. This combination of resin concentration and metering rod gave more uniform resin coating on the fabric. The impregnated fabric was air dried.

A single ply of this prepreg was placed in a vacuum bag. The bag was evacuated of air and then a slight flow of dry nitrogen was then passed continuously through the bag to eliminate presence of oxygen. The bag was placed in a platten press heated to 170° C. A pressure of 1380 kPa was applied to the bag. The bag was held at 170° C. for 1 hr then heated up to 220° C. over ~30 minutes, then held at 220° C. for 2 hours. The sample was then allowed to cool.

Dielectric properties of the sheet was measured per Method 2, with results summarized in Table 7:

TABLE 7

| Conditions | Dk (2.55 GHz) | Df (2.55 GHz) |
|---|---|---|
| 21° C./dry | 3.43 | 0.004 |
| 85° C./85% RH | 3.48 | 0.008 |

Example 17

62.124 g of "Stereon" 857 and 20.708 g of "Ricon" 100 (both styrene-butadiene copolymers) was dissolved in 155.289 g toluene at room temperature overnight with agitation using a magnetic stirrer. The temperature of the solution was then raised to 80° C. Added to this solution was 20.708 g of triallyl trimellitate (Aldrich product number 48146-7, CAS no. 2694-54-4), 19.776 g of Saytex 120 flame retardant, 4.866 g antimony oxide, and 2.0708 g Luperox F free radical initiator from AtoFina. The mixture was stirred for 1 hr with a magnetic stirrer.

2N710 papers were impregnated with this resin similar to Comparative Example 1. The sheet was air dried to remove residual volatiles. The weight fraction of resin in the impregnated composite sheet after solvent removal was 58%.

Multiply CTE samples was cut and stacked from this prepreg sheet and placed in a vacuum bag. The stack was cured by placing the bag in a platten press and closing the plattens just enough to ensure contact with the sample. The cure cycle was as follows: ramp from 30° C. to 180° C. over ~30 minutes; held at 180° C. for 2 hours then heated to 240° C. over ~30 minutes and held at 240° C. for 2 hours, then heated to 290° C. over 30 min, held for 10 min. Heat to the press was then turned off and allowed to cool slowly. CTE measurements were made per IPC-TM-650 Number 2.4.24.5 Method A.

Specimen for dielectric measurements were made using a single ply sample. Cure procedure was the same as for multiply CTE sample. Measurement was made with Method 2 described earlier. Results of these measurements are shown in Table 8.

TABLE 8

| Laminate properties | Example 17 |
|---|---|
| Dielectric constant (2.55 GHz) | |
| dry/20° C. | 2.80 |
| 85° C./85% RH for 1 day | 3.07 |
| Dissipation factor (2.55 GHz) | |
| dry/20° C. | 0.005 |
| 85° C./85% RH for 1 day | 0.019 |
| CTE (ppm/° C., 50–150° C.) | |
| x (in plane) | 8.9 |
| z (through thickness) | 118 |

What is claimed is:

1. A composite sheet comprising a polymeric matrix and one or more woven or non-woven para-aramid or fiberglass fabric or paper, said polymeric matrix consisting essentially of one or more copolymers of monovinyl aromatic hydrocarbons and conjugated dienes; said one or more copolymers being either cross-linked or not cross-linked, and wherein the -para-aramid or fiberglass fibers in said woven or non-woven fabrics or papers occupy 20 to 60 volume-% of said composite sheet.

2. The composite sheet of claim 1 wherein said -para-aramid or fiberglass fibers in said woven or non-woven fabrics or papers occupy 30 to 50 volume-% of said composite sheet.

3. The composite sheet of claim 1 wherein said one or more copolymers are cross-linked.

4. The composite sheet of claim 3 further comprising cross-links in the form of diradical moieties derived from one or more coagents.

5. The composite sheet of claim 4 wherein said one or more coagents are selected from the group consisting of triallyl cyanurate, triallyl isocyanurate, divinyl benzene, trivinyl cyclohexane, diallyl phthalate, triallyl trimellitate, triallyl trimesate, ethylene glycol dimethacrylate, butylene glycol dimethacrylate, trifunctional methacrylates, and tetrabromobisphenol A diallyl ether.

6. The composite sheet of claim 1 wherein said one or more copolymers are not cross-linked.

7. The composite sheet of claim 6 further comprising one or more free-radical initiators.

8. The composite sheet of claim 7 further comprising one or more coagents.

9. The composite sheet of claim 8 wherein at least one said one or more coagents is selected from the group consisting of triallyl cyanurate, triallyl isocyanurate, divinyl benzene, trivinyl cyclohexane, diallyl phthalate, triallyl trimellitate, triallyl trimesate, ethylene glycol dimethacrylate, butylene glycol dimethacrylate, trifunctional methacrylates, and tetrabromobisphenol A diallyl ether.

10. The composite sheet of claim 1 wherein the woven or non-woven para-aramid or fiberglass fabric or paper is para-aramid fabric or paper.

11. The composite sheet of claim 10 wherein the para-aramid fabric or paper is para-aramid paper.

12. The composite sheet of claim 10 or claim 11 wherein the para-aramid comprises a homopolymer resulting from stoichiometric polymerization of p-phenylene diamine and terephthaloyl chloride or a copolymer resulting from incorporation of small amounts of other diamines with the p-phenylene diamine and of small amounts of other diacid chlorides with the terephthaloyl chloride.

13. The composite sheet of claim 12 wherein the woven or non-woven para-aramid fabric or paper comprises from 5 to 25 weight percent poly(m-phenylene isophthalamide) fibrids and 75 to 95 weight percent p-para-aramid floc and is characterized by a basis weight of between 0.8 to 4.0 ounces per square yard.

14. The composite sheet of claim 1 wherein said copolymer is a copolymer of styrene and butadiene.

15. The composite sheet of claim 14 wherein said copolymer is a styrene-butadiene-styrene block copolymer.

16. The composite sheet of claim 15 wherein said styrene moiety represents 30 to 50% by weight of the block copolymer, and the butadiene moiety represents 70 to 50% by weight of the block copolymer.

17. The composite sheet of claim 1 further comprising a conductive metallic layer disposed thereupon.

18. The composite sheet of claim 17 wherein the metallic layer is patterned to provide the electronically conductive pathways of an electronic circuit.

19. A printed circuit board comprising one or more layers of circuitry whereof at least one said layer comprises a composite sheet having disposed upon the surface thereof a metallic layer, and a plurality of electronic circuit elements, said electronic circuit elements being disposed upon said composite sheet and said metallic layer being patterned to provide electronically conductive pathways to interconnect the electronic circuit elements; said composite sheet comprising a polymeric matrix and one or more woven or non-woven para-aramid or fiberglass fabric or paper, wherein said -para-aramid or fiberglass fibers in said woven or non-woven fabrics or papers occupy 20 to 60 volume-% of said composite sheet, said polymeric matrix consisting essentially of one or more cross-linked copolymers of monovinyl aromatic hydrocarbons and conjugated dienes.

20. The printed circuit board of claim 19 wherein said -para-aramid or fiberglass fibers in said woven or non-woven fabrics or papers occupy 30 to 50 volume-% of said composite sheet, said composite sheet further comprising cross-links in the form of diradical moieties derived from one or more coagents selected from the group consisting of triallyl cyanurate, triallyl isocyanurate, divinyl benzene, trivinyl cyclohexane, diallyl phthalate, triallyl trimellitate, triallyl trimesate, ethylene glycol dimethacrylate, butylene glycol dimethacrylate, trifunctional methacrylates, and tetrabromobisphenol A diallyl ether; wherein the woven or non-woven para-aramid fabric or paper is para-aramid paper; and, wherein said copolymer is a styrene-butadiene-styrene block copolymer.

21. A process for fabricating a composite sheet the process comprising infusing into a woven or non-woven para-aramid or fiberglass fabric or paper a solution or dispersion comprising a polymeric matrix consisting essentially of at least one block copolymer comprising blocks formed from monovinyl aromatic hydrocarbon monomer units and blocks formed from conjugated diene monomer units; contacting said copolymer with a free radical initiator and a coagent, and heating the thus formed combination to a temperature at which the free radical initiator is activated in order to effect cross-linking.

22. The process of claim 21 further comprising adhesively contacting said composite sheet with a metallic layer either before or after cross-linking is effected.

23. The process of claim 22 further comprising applying a pattern to said metallic layer using photolithographic methods.

24. The process of claim 23 further comprising adhesively combining two or more of said composites having a patterned metallic layer disposed upon the surface thereof into a multilayer structure.

25. The process of claim 21 wherein the copolymer comprises a styrene-butadiene-stryene block copolymer.

26. The process of claim 21 wherein the non-woven or woven fabric sheet or paper is an para-aramid.

27. The process of claim 26 wherein the para-aramid comprises a homopolymer resulting from stoichiometric polymerization of p-phenylene diamine and terephthaloyl chloride or a copolymer resulting from incorporation of small amounts of other diamines with the p-phenylene diamine and of small amounts of other diacid chlorides with the terephthaloyl chloride.

28. The process of claim 27 wherein the woven or non-woven para-aramid fabric, sheet, or paper is a non-woven para-aramid sheet comprising from 5 to 25 weight percent poly(m-phenylene isophthalamide) fibrids and 75 to 95 weight percent p-para-aramid floc.

* * * * *